United States Patent [19]

McClure

[11] 4,256,781
[45] Mar. 17, 1981

[54] METHOD OF FORMING ELECTRICAL COMPONENTS OVER MAGNETIC IMAGES

[75] Inventor: Richard J. McClure, San Diego, Calif.

[73] Assignee: Eastman Technology, Inc., Rochester, N.Y.

[21] Appl. No.: 22,540

[22] Filed: Mar. 21, 1979

Related U.S. Application Data

[62] Division of Ser. No. 885,928, Mar. 13, 1978, abandoned.

[51] Int. Cl.³ .............................................. B05D 3/14
[52] U.S. Cl. ...................................... 427/47; 427/98; 427/131; 427/132; 427/197; 427/205
[58] Field of Search ................... 427/47, 98, 131, 132, 427/197, 205; 156/233

[56] References Cited

U.S. PATENT DOCUMENTS 3,880,689  3/1975  Rolker et al. ...................... 156/233

Primary Examiner—Bernard D. Pianalto
Attorney, Agent, or Firm—Robert F. Cody

[57] ABSTRACT

A conductor device is formed by recording a magnetic record track on a record medium (for example, ordinary magnetic recording tape), applying a catalytic toner to the recorder track, and then electrolessly plating a conductive layer on the toned record track.

3 Claims, 10 Drawing Figures

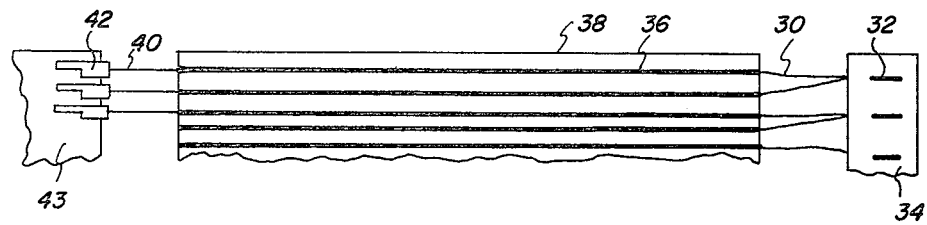
FIG. 5
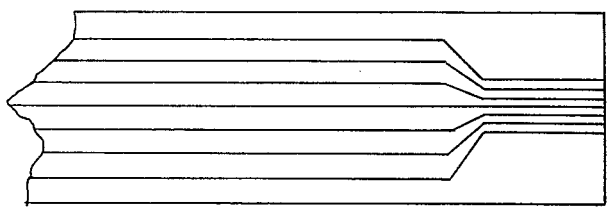
FIG. 6a
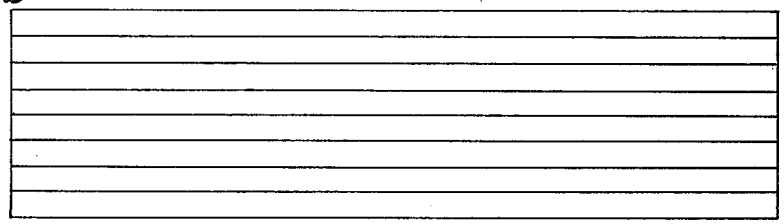
FIG. 6b
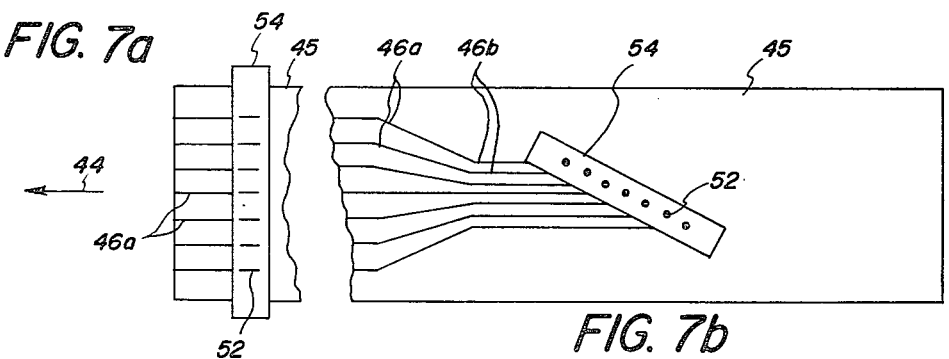
FIG. 7a
FIG. 7b
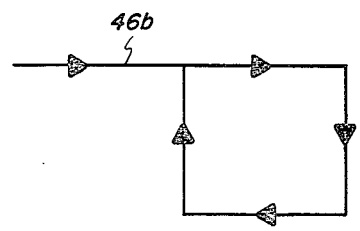
FIG. 8

METHOD OF FORMING ELECTRICAL COMPONENTS OVER MAGNETIC IMAGES

This is a division of application Ser. No. 885,928, filed Mar. 13, 1978 and now abandoned.

BACKGROUND OF THE INVENTION

1. Field of the Invention

The present invention relates to electrical components, to a method of forming a conductive track on a magnetic record medium and, more particularly, to such a method employing electroless plating.

2. Description Relative to the Prior Art

In order to connect a high density, multi-track recording head to an electronics package, it is necessary to devise a suitable multi-conductor connector device. For example, a bundle of wires may be provided having an end of each wire connected to an individual recording head and the other end connected to a terminal of the electronics package. Alternatively, a printed circuit may be employed which comprises a substrate (flexible or rigid depending upon the application) having a plurality of conductive tracks formed on one or both sides of the circuit board. The recording head and the electronics package are connected to the printed circuit board through short wires. Such circuit boards are generally manufactured using a photolithographic process.

In the case of a high density, multi-track recording head the problem of connecting the head to the electronics package becomes more acute. Consider the manufacture of recording heads having track densities on the order of 500 heads per inch: When it is considered that each individual head may have three or more electrical connections, it becomes apparent that prior art methods of connecting recording heads to an electronics package are unsatisfactory. If wire connections are used, for example, space requirements coupled with the extremely large number of electrical connections necessitates the use of extremely fine wires. In a bundle of 500 or more thin and fragile wires, breakage of some is almost unavoidable unless great care is taken to handle the wires delicately. The use of printed circuit boards may appear to avoid this problem somewhat because the conductive tracks are formed on a relatively durable substrate. The problem with printed circuit boards, however, is that conductive tracks can only be formed at a density less than about 250 tracks per inch, even assuming that conductive tracks are formed on both sides of the printed circuit board. The problem thus remains of how to connect a high density, multi-track record head to an electronics package.

U.S. Pat. Nos. 3,633,189 and 3,805,213 disclose connector devices for electrically connecting a multi-track magnetic record head to an electronics package. Each of these patents discloses a cable structure comprising a substrate of nonconductive material having a large number of conductive tracks formed thereon. The substrate is shaped and the conductive tracks are formed in such a manner that the substrate can be folded or bent to permit a larger number of connecting paths to be concentrated within a small area at the end of the cable than would otherwise be possible. It would appear, however, that such cable connectors are not suitable for use with the high density, multi-track record heads discussed above.

SUMMARY OF THE INVENTION

The present invention provides a method for making a conductor device which is suitable for use in connecting electronic components such as a high density, multi-track record head to electronic signal processing circuitry. The conductor device of the present invention is durable, relatively easy to manufacture, and is well suited for applications wherein a high density of conductors is required. In a presently preferred embodiment, the multi-conductor device is made by recording a plurality of magnetic record tracks on a magnetic record medium. The magnetic record tracks may be recorded, for example, on ordinary magnetic recording tape using a multi-track magnetic record head. The magnetic record tracks are contacted with a catalytic magnetic toner which includes an electroless plating catalyst. The toned magnetic record tracks are then electrolessly plated to form a conductive track of plated material on the record track. In addition, the present invention provides a method of fanning out and squeezing together the magnetic record tracks (and thus the conductive tracks) by rotating the multi-track magnetic record head relative to the magnetic record medium during recording. Still further, each conductive track can be provided with an electrical connection tab portion by mechanically offsetting the tracks and re-recording.

BRIEF DESCRIPTION OF THE DRAWINGS

In the detailed description of the preferred embodiments of the invention presented below, reference is made to the accompanying drawings, in which:

FIG. 5 shows an electrical connection to a conductor device of the present invention;

FIGS. 6a and 6b show certain conductive track configurations;

FIGS. 7a and 7b show a method in accordance with the present invention for fanning out and squeezing together conductive tracks; and FIG. 8 is useful to illustrate a method for producing electrical connections on the ends of conductive tracks.

DESCRIPTION OF THE PREFERRED EMBODIMENTS

The electroless metal plating process generally employs a chemical reducing agent to reduce a metal salt in an aqueous solution. The reduced metal is deposited on a catalytic surface. Because the deposition of the metal is not dependent on a current distribution, the plated metal is uniform in thickness regardless of the shape or size of the plated surface. This aspect of electroless plating is particularly advantageous for those applications wherein the plated metal layer forms a conductive element for an electric current. Materials which are suitable catalysts in the electroless plating process include tin and metals of Group IB and VIII of the periodic table, and mixtures thereof. A general form of electroless plating over magnetic images is disclosed in U.S. Pat. No. 3,880,689 to J. H. Rolker et al, issued Apr. 29, 1975, which is hereby incorporated by reference. As disclosed in that patent, a latent magnetic image on a magnetic record surface is contacted with an image developer. The image developer comprises a magnetically attractable toner which includes a suitable catalyst for the electroless plating process. The toned magnetic image is electrolessly plated to provide it with density and contrast.

Figure 1:
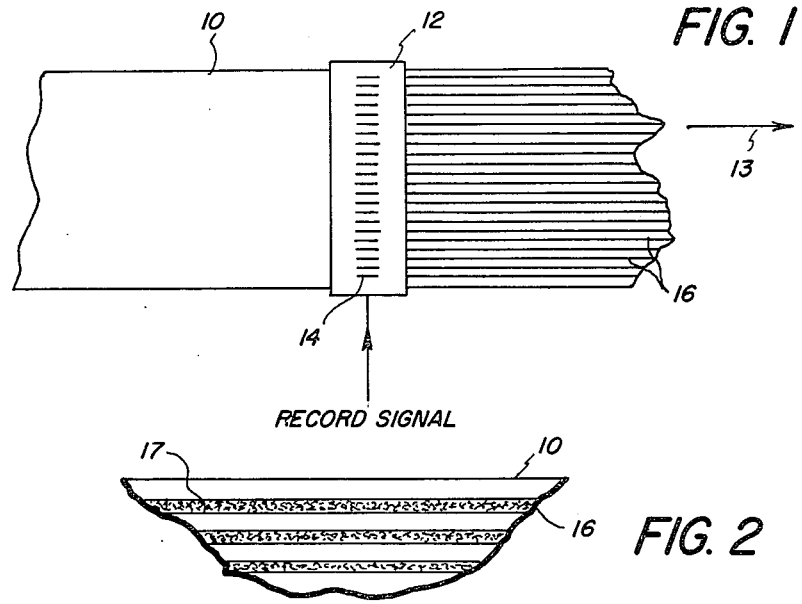
FIGS. 1, 2, 3 and 4 illustrate a presently preferred embodiment of the invention for forming a conductor device.

The present invention employs an electroless plating process in conjunction with a method for forming a catalytic surface to make a conductor device which is suitable for use as a high density, multi-conductor connector. FIG. 1 shows a method of recording magnetic record tracks on a magnetic record medium. A magnetic record medium in the form of a magnetic tape 10 is transported past a multi-track record head 12 in the direction shown by arrow 13. The record head 12 is of multiple head construction and comprises a plurality of individual magnetic record heads 14. The record heads 14 are driven by a record signal which, for present purposes, is assumed to be a constant amplitude, fixed frequency signal. The result is that a plurality of magnetic record tracks 16 are recorded on the tape 10 which correspond to the individual record heads 14.

Figure 2:
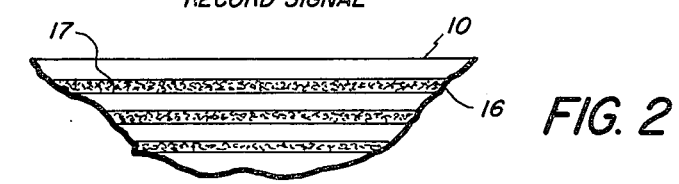
Figure 3:
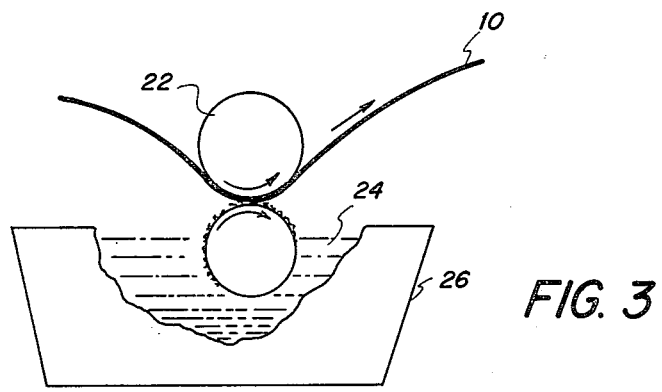

FIG. 2 shows a portion of the magnetic tape 10 having magnetic record tracks 16 recorded thereon. The record tracks 16 are contacted with a catalytic magnetic toner 17 which includes a catalyst, or sensitizer, for an electroless plating process. The magnetic toner and the catalyst therein thus adhere to the individual record tracks 16. Excess toner is removed from non-recorded portions of the magnetic recording tape 10 by squeegeeing, blowing, etc. Referring to FIG. 3, the toned magnetic tape 10 passes over a guide roller 22 which is arranged to wet the surface of the tape 10 with an electroless plating bath solution 24 contained in a reservoir 26. The plating bath 24 may be of any of the types well known in the art. Generally, the plating bath includes a metal salt to supply the metal which is ultimately plated on the toned areas of the magnetic tape 10. A reducer is included in the bath to provide chemical reduction of the metal salt. A complexing agent is generally provided to "tie up" the metal ions to such a degree that the ions are not reduced spontaneously in the presence of the reducing agent. The complexing agent, however, should not bind the metal ions so tightly that they will be unable to be reduced by the reducing agent in the presence of the catalytic surface. The plating bath 24 can also include a variety of other materials to facilitate maintenance and operation of the developer and to improve the quality of the developed image. Examples of such materials include acids and bases to adjust, pH, buffers, preservatives, thickening agents, etc.

The development time, and thus the plating thickness, of the toned track on the magnetic tape 10 is controlled by the speed at which the guide roller 22 passes the tape 10 through the bath 24.

Figure 4:
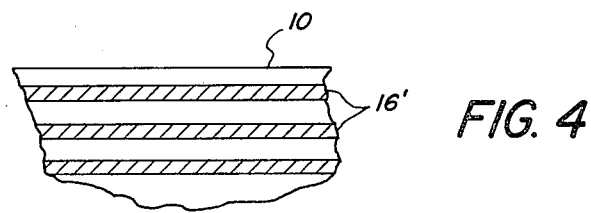

An enlarged portion of the post-plated magnetic record tape 10 is as shown in FIG. 4. The toned magnetic record tracks 16' are plated with a thin layer of metal. The type of metal used in an electroless plating bath can be any of the well-known metals which are electrolessly plateable and which are suitable to the particular application. In the cases of electrical conductors, copper is one example of a useful metal which can be electrolessly plated by the above-described method.

A multi-conductor connector device can be formed, using the above-described process, which is suitable for connecting a high density, multi-track recording head with its associated electronic circuitry. For example, assume that the magnetic recording head has 500 heads per inch and that each head has two electrical connections. In accordance with the present invention, magnetic record tracks are recorded on a magnetic record medium at a density of 1000 tracks per inch to provide record tracks which are 0.0005 inches in width and spaced apart by a distance equal to their width. The recorded magnetic tracks are then toned with a catalytic magnetic toner and are plated with a metal in accordance with the above-described process. A portion of the resulting conductor device is shown in FIG. 5. Two wires 30 from each individual recording head 32 of a multi-head structure 34 can be electrically connected to adjacent conductive tracks 36 on a magnetic recording tape 38. Likewise, small wires 40 connect the conductive tracks 36 to terminal tabs 42 of an electrical connector 43.

Because of the extremely high head densities which are involved in the above example, it is apparent that it would be highly desirable to "fan in" the conductive tracks 36 at the end portions of the tape 38. For example, FIG. 6a shows a configuration of conductive tracks which, in many applications, would represent a highly desirable improvement over the track configuration shown in FIG. 6b. The above-disclosed method, however, for recording magnetic record tracks (which later become conductive tracks) employs a multi-track magnetic record head. Since the spacing between individual record heads is fixed, it would not appear to be simple modification to make spacing changes so as to fan in the recorded magnetic record tracks.

The present invention, nevertheless, provides a method for recording fanned in magnetic record tracks using the same multi-track record head as described above. Referring to FIG. 7a, recording by the multi-head structure 54 begins as a tape 45 travels past the head 54 in the direction indicated by arrow 44. A series of tracks 46a are recorded which are spaced apart by an amount which is determined by the individual head 52 spacings of the head structure 54. In accordance with the present invention, the head structure 54 is now rotated to a position shown in FIG. 7b as the tape 45 continues to advance. Such rotation of the head structure 54 causes the magnetic record tracks 46a to be squeezed together. The head structure 54 remains in its angled orientation as the magnetic tape 45 continues to travel. The result is that a length of closely spaced tracks 46b are recorded. The recorded magnetic record tracks 46b thus are fanned in. The result of rotating the head structure 54 in the manner described above is to produce a magnetic tape having a recorded magnetic record track configuration as shown in FIG. 6a. Toning and plating take place as described above to produce a multi-conductor connector device which, while accommodating a high density of conductive tracks, provides fanned in end portions to facilitate the electrical connections thereto. Another advantage of rotating the head structure 54 during the recording of the magnetic record tracks is that the density of the individual recording heads 52 need not be as high as the desired density of magnetic record tracks. This advantage becomes extremely important when it is desired to make a conductor element having conductive tracks which are tightly spaced.

It would also be a highly desirable improvement to provide the ends of each conductive track with a tab portion comprising a plated layer of metal which is thicker and/or wider than the rest of the conductive tracks 50. In accordance with the present invention, this is done by mechanically offsetting tracks and re-recording as depicted in FIG. 8.

In general, it is seen that the present invention provides a method for recording magnetic record tracks on a magnetic record medium, toning the magnetic record track with a catalytic magnetic toner and plating the toned record track with a metal. This method can be used to manufacture electrical circuit boards, connectors, or other devices wherein it is desired to form a conductive pattern. Closely spaced conductive tracks can be formed by using a high density, multi-track record head to record the magnetic record tracks on the record medium. Alternatively, a single conductive track can be formed by a single record record head.

The present invention is also useful in the formation of circuit components: To form a resistor, for example, it is only necessary to record a magnetic record track of such a length and width that when plated with a layer of conductive material a resistance of the desired value is obtained.

A capacitor can be conveniently formed by starting out with a magnetic record medium which is sensitive to magnetic recording on both sides. The record signal which drives the magnetic recording head is adjusted such that a magnetic record track is recorded on both sides of the record medium. The record medium is then toned (on both sides) with a catalytic magnetic toner and metal is plated on the toned images by the above-described process. The result is a nonconductive record medium which separates two areas of conductive material. The capacitance of the resultant device is controlled by varying the area of the recorded magnetic images.

In the above embodiments, a magnetic record head has been used to record a magnetic record track, or a record area, on a magnetic record medium. Depending upon the application, it is also possible to use other means to form the magnetic image. For example, in the formation of a capacitor as described above, the magnetic image areas were recorded using a magnetic record head. If the image areas are relatively wide, as would be the case for a capacitor of relatively high capacitance, one is then faced with the alternative of using a wide magnetic recording head or making several sweeps across the magnetic record medium. As an alternative, a template can be prepared which is superposed on the magnetic record medium. A magnetic field is applied to the template to selectively magnetize portions of the record medium not protected thereby. For example, a template can be fabricated by punching out apertures in an ordinary piece of steel or like metal.

The invention has been described in detail with particular reference to preferred embodiments thereof, but it will be understood that variations and modifications can be effected within the spirit and scope of the invention. For example, it would be within the scope of the invention to record magnetically the complete tape, and then selectively erase, e.g. thermo-erase. Also, it is noted that the toned image may be transferred prior to plating from the magnetic tape to another prepared substrate, such as polyimide film (Kapton$^R$) as is commonly now used for printed circuit tape to be used at high temperature.

What is claimed is:

1. A method of making a multi-conductor device having fanned conductive tracks, said method comprising the steps of:

using a multi-track magnetic recording head to record magnetic record tracks on a magnetic record medium;

while not substantially reducing the degree of magnetization of said record medium as effected by means of said head, rotating the multi-track magnetic recording head relative to the magnetic record medium during recording;

contacting said magnetic record tracks with a catalytic magnetic toner which includes an electroless plating catalyst; and electrolessly plating the toned magnetic record tracks with a conductive material.

2. A method of making a multi-conductor device comprising strips of conductive material on a magnetic record medium, which conductive strips are fanned to facilitate connection of the ends of the multi-conductor device, said method comprising the steps of:

using a multi-track magnetic record head to record magnetic record tracks on a magnetic record medium;

while not substantially reducing the degree of magnetization of said record medium as effected by means of said head, rotating, during recording of the magnetic record tracks, the multi-track magnetic record head relative to the magnetic record medium to fan the magnetic record tracks;

applying a magnetic toner to said magnetic record tracks which is sensitized with an electroless plating sensitizer; and electrolessly plating the toned magnetic record tracks to form a conductive track of plated material on said record tracks.

3. The method of claim 1 including the step of:

varying the signal applied to the recording head to record a larger amplitude signal at the end portion of the recorded record track, whereby when the toned magnetic record tracks are electrolessly plated with conductive material, the plated conductive tracks become thicker and wider over the end portion of the record track, thus forming a tab portion.

* * * * *

UNITED STATES PATENT AND TRADEMARK OFFICE
CERTIFICATE OF CORRECTION

PATENT NO. : 4,256,781
DATED : March 17, 1981
INVENTOR(S) : Richard J. McClure

It is certified that error appears in the above-identified patent and that said Letters Patent are hereby corrected as shown below:

In the "Abstract", line 4, "recorder" should read ---recorded---.

Column 3, line 59, "cases" should read ---case---.

Column 4, line 26, "be simple" should read ---be a simple---.

Signed and Sealed this

Second Day of June 1981

[SEAL]

Attest:

RENE D. TEGTMEYER

Attesting Officer

Acting Commissioner of Patents and Trademarks